United States Patent
Arai et al.

(10) Patent No.: US 7,440,248 B2
(45) Date of Patent: Oct. 21, 2008

(54) SEMICONDUCTOR INTEGRATED CIRCUIT DEVICE

(75) Inventors: Katsuya Arai, Kyoto (JP); Toshihiro Kougami, Kyoto (JP); Masayuki Kamei, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 108 days.

(21) Appl. No.: 11/358,045

(22) Filed: Feb. 22, 2006

(65) Prior Publication Data

US 2006/0209478 A1  Sep. 21, 2006

(30) Foreign Application Priority Data

Mar. 17, 2005  (JP)  ............................. 2005-077411

(51) Int. Cl.
  *H02H 3/20* (2006.01)
  *H02H 3/22* (2006.01)
  *H02H 9/04* (2006.01)
(52) U.S. Cl. ......................... 361/56; 361/111; 361/91.1
(58) Field of Classification Search ................... 361/56, 361/111, 91.1
  See application file for complete search history.

(56) References Cited

U.S. PATENT DOCUMENTS

| | | | | |
|---|---|---|---|---|
| 5,255,146 A | * | 10/1993 | Miller | 361/56 |
| 5,565,790 A | * | 10/1996 | Lee | 326/30 |
| 5,946,177 A | * | 8/1999 | Miller et al. | 361/56 |
| 6,008,970 A | * | 12/1999 | Maloney et al. | 361/56 |
| 6,400,540 B1 | * | 6/2002 | Chang | 361/56 |
| 6,765,771 B2 | * | 7/2004 | Ker et al. | 361/56 |
| 6,768,616 B2 | * | 7/2004 | Mergens et al. | 361/56 |
| 7,102,864 B2 | * | 9/2006 | Liu et al. | 361/56 |
| 7,212,387 B2 | * | 5/2007 | Duvvury et al. | 361/56 |
| 2002/0053704 A1 | * | 5/2002 | Avery et al. | 257/361 |
| 2002/0153571 A1 | | 10/2002 | Mergens et al. | |
| 2003/0076636 A1 | * | 4/2003 | Ker et al. | 361/56 |
| 2006/0055438 A1 | * | 3/2006 | Chen et al. | 327/143 |

FOREIGN PATENT DOCUMENTS

JP  2004-531047 A  10/2004
WO  WO 02/37566 A2  5/2002

* cited by examiner

*Primary Examiner*—Michael J Sherry
*Assistant Examiner*—Zeev Kitov
(74) *Attorney, Agent, or Firm*—McDermott Will & Emery LLP (57) ABSTRACT

A semiconductor integrated circuit device includes: a protected circuit protected against electro-static discharge applied from outside the device; an SCR protection circuit having an anode terminal connected to a power line, a cathode terminal connected to a ground line and a trigger terminal; and a trigger circuit connected to the trigger terminal and including an RC circuit connected between the power line and the ground line.

16 Claims, 7 Drawing Sheets

SEMICONDUCTOR INTEGRATED CIRCUIT DEVICE

CROSS-REFERENCE TO RELATED APPLICATION

The disclosure of Japanese Patent Application No. 2005-77411 filed in Japan on Mar. 17, 2005 including specification, drawings and claims is incorporated herein by reference in its entirety;

BACKGROUND OF THE INVENTION

The present invention relates to semiconductor integrated circuit devices including electro-static discharge (ESD) protection circuits, and particularly relates to semiconductor integrated circuit devices including silicon-controlled rectifier (SCR) protection circuits incorporated in ESD protection circuits.

With recent developments of technology in processing field, such as miniaturization and increase in density, semiconductor integrated circuit devices are more and more susceptible to damage from ESD (hereinafter, referred to as a surge). For example, there is an increasing possibility that a surge entering from an external connector pad destroys a device, such as an input circuit, an output circuit, an input/output circuit or an internal circuit, to cause degradation of device performance. Accordingly, the semiconductor integrated circuit devices include ESD protection circuits added to external connector pads and used for protecting input circuits, output circuits, input/output circuits and internal circuits against surges.

Figure 13:
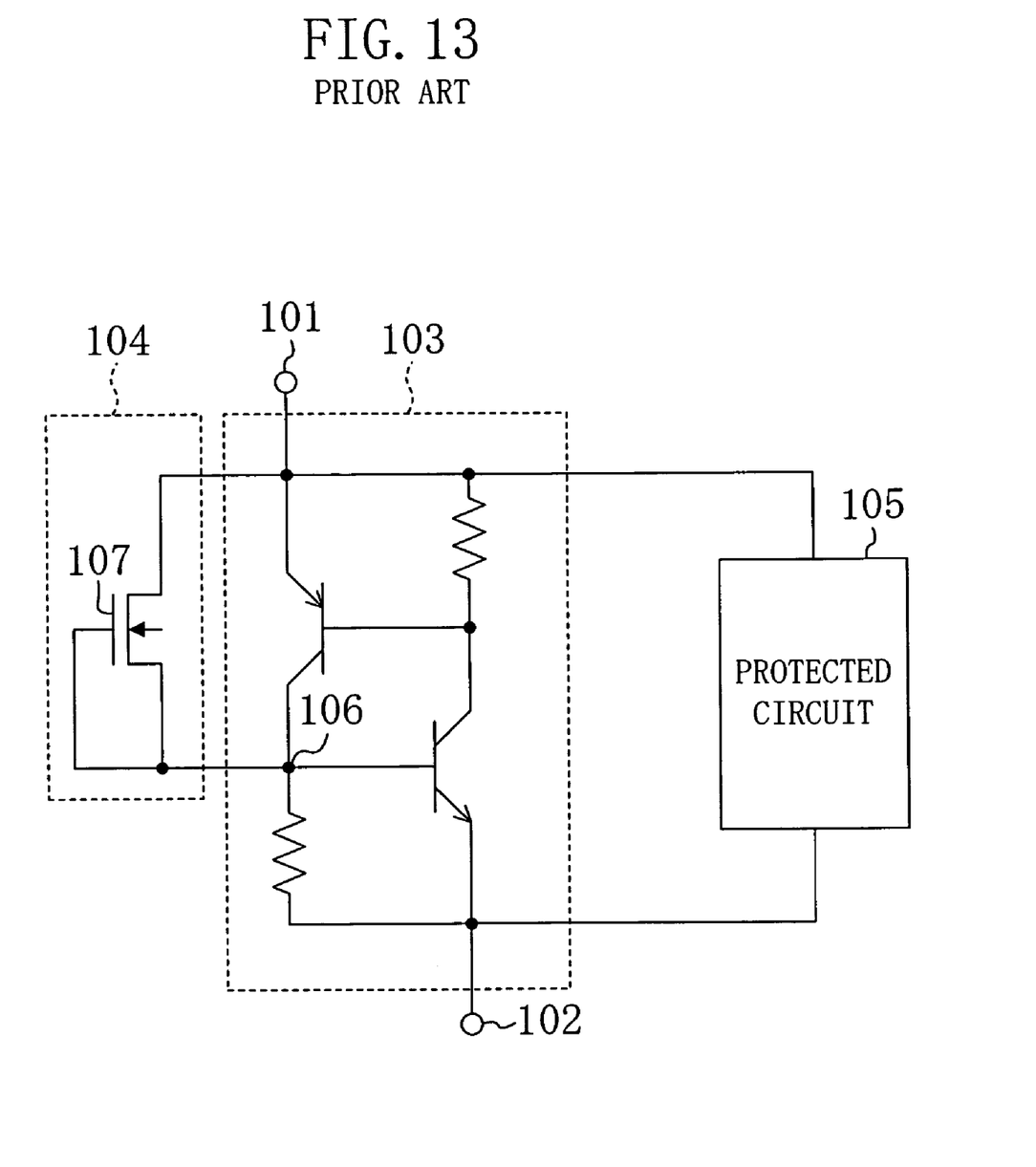
FIG. 13 is a circuit diagram illustrating a conventional semiconductor integrated circuit device including an ESD protection circuit.

FIG. 13 illustrates a circuit configuration of a conventional semiconductor integrated circuit device including an ESD protection circuit (see, for example, Japanese translation of PCT international application No. 2004-531047). As illustrated in FIG. 13, the conventional semiconductor integrated circuit device includes: a power line 101, a ground line 102; an SCR protection circuit 103; a trigger circuit 104 connected to the SCR protection circuit 103 in parallel with each other; and a protected circuit 105 protected against surges and having a desired circuit function. The SCR protection circuit 103 is configured to protect the protected circuit 105 against surges entering from the power line 101 by making the surges flow into the ground line 102.

The SCR protection circuit 103 is provided between the power line 101 and the ground line 102 and is made of, for example, a pnp bipolar transistor and an npn bipolar transistor which share a connector and a base, as described with transistor symbols. The collector of the npn bipolar transistor serves as a trigger terminal 106.

The trigger circuit 104 is provided between the power line 101 and the trigger terminal 106 and includes an NMOS transistor 107 having its drain connected to the power line 101 and the source and gate connected to the trigger terminal 106 of the SCR protection circuit 103.

The protected circuit 105 is connected to the power line 101 and the ground line 102.

In the conventional semiconductor integrated circuit device having the foregoing configuration, upon application of a positive surge between the power line 101 and the ground line 102, the nMOS transistor 107 forming the trigger circuit 104 breaks down to cause a positive voltage to be applied to the trigger terminal 106, so that current (SCR trigger current) starts to flow from the trigger terminal 106 into the ground line. This SCR trigger current turns the SCR protection circuit 103 ON, so that a flow of current (latch-up phenomenon) is maintained at a very low ON resistance between the anode and the cathode of the SCR protection circuit 103. Accordingly, the protected circuit 105 is protected against a positive surge entering through the power line 101 from outside the device.

However, in the conventional semiconductor integrated circuit device, when a surge of positive charge is applied to the power line 101 with the ground line 102 grounded, the protected circuit 105 might be destroyed under miniaturization in processing.

This is because the thickness of a gate oxide film of a MOS transistor included in the protected circuit 105 is reduced with miniaturization in processing and, therefore, the breakdown voltage of the gate oxide film decreases, so that the ON voltage, which is determined according to the breakdown voltage of the nMOS transistor 107, of the SCR protection circuit 103 can be higher than the breakdown voltage of the gate oxide film of the transistor included in the protected circuit 105. That is, the potential at the power line 101 exceeds the breakdown voltage of the gate oxide film of the MOS transistor before the SCR protection circuit 103 turns ON, resulting in destruction of the gate oxide film of the transistor included in the protected circuit 105.

SUMMARY OF THE INVENTION

It is therefore an object of the present invention to provide a semiconductor integrated circuit device having an ESD protection ability satisfying a criterion of a surge withstand test in view of miniaturization in processing.

In order to achieve this object, a semiconductor integrated circuit device including an SCR protection circuit according to the present invention has a configuration in which an RC circuit is used for a trigger circuit for generating trigger current in the SCR protection circuit. This configuration allows control of a voltage at which trigger current for starting the SCR protection circuit is generated so that the ON voltage of the SCR protection circuit is lower than the breakdown value of the gate oxide film of a transistor in a protected circuit.

Specifically, a semiconductor integrated circuit device according to the present invention includes: a protected circuit protected against electro-static discharge applied from outside the device; an SCR protection circuit having an anode terminal connected to a power line, a cathode terminal connected to a ground line and a trigger terminal; and a trigger circuit connected to the trigger terminal and including an RC circuit connected between the power line and the ground line.

In this semiconductor integrated circuit device according to the present invention, as trigger current in the SCR protection circuit, not breakdown current of, for example, a MOS transistor but ON current of the MOS transistor is allowed to be used. Accordingly, the SCR protection circuit turns ON at a voltage lower than the breakdown voltage of the gate oxide film of a transistor forming a protected circuit. As a result, even if the process (design rule) is miniaturized, the resistance against surges is increased so that a high ESD protection performance ability satisfying a criterion of a surge withstand test is obtained.

The semiconductor integrated circuit device preferably further includes a first resistor connected between the cathode terminal and the trigger circuit.

The semiconductor integrated circuit device preferably further includes a second resistor connected between the anode terminal and the trigger circuit.

This enables adjustment of the voltage value at which trigger current in the SCR protection circuit.

Preferably, in the semiconductor integrated circuit device, the trigger terminal of the SCR protection circuit is connected to the ground line, and the trigger circuit includes: a p-transistor having one terminal connected to the power line and another terminal connected to the trigger terminal; an inverter having an output terminal connected to a gate of the p-transistor; a capacitor having one terminal connected to the power line and another terminal connected to an input terminal of the inverter; and a third resistor having one terminal connected to the input terminal of the inverter and another terminal connected to the ground line.

Preferably, in the semiconductor integrated circuit device, the trigger terminal of the SCR protection circuit is connected to the ground line, and the trigger circuit includes: an n-transistor having one terminal connected to the power line and another terminal connected to the trigger terminal; an inverter having an output terminal connected to a gate of the n-transistor; a capacitor having one terminal connected to the ground line and another terminal connected to an input terminal of the inverter; and a third resistor having one terminal connected to the input terminal of the inverter and another terminal connected to the power line.

Preferably, in the semiconductor integrated circuit device, the trigger terminal of the SCR protection circuit is connected to the power line, and the trigger circuit includes: a p-transistor having one terminal connected to the ground line and another terminal connected to the trigger terminal; an inverter having an output terminal connected to a gate of the p-transistor; a capacitor having one terminal connected to the power line and another terminal connected to an input terminal of the inverter; and a third resistor having one terminal connected to the input terminal of the inverter and another terminal connected to the ground line.

Preferably, in the semiconductor integrated circuit device, the trigger terminal of the SCR protection circuit is connected to the power line, and the trigger circuit includes: an n-transistor having one terminal connected to the ground line and another terminal connected to the trigger terminal; an inverter having an output terminal connected to a gate of the n-transistor; a capacitor having one terminal connected to the ground line and another terminal connected to an input terminal of the inverter; and a third resistor having one terminal connected to the input terminal of the inverter and another terminal connected to the power line.

In the semiconductor integrated circuit device, if the SCR protection circuit includes the inverter, the inverter is preferably a Schmitt trigger circuit.

Preferably, in the semiconductor integrated circuit device, the trigger terminal of the SCR protection circuit is connected to the ground line, and the trigger circuit includes: a p-transistor having one terminal connected to the power line and another terminal connected to the trigger terminal; a NAND gate having an output terminal connected to a gate of the p-transistor; a capacitor having one terminal connected to the power line and another terminal connected to a first input terminal of the NAND gate; a third resistor having one terminal connected to the first input terminal of the NAND gate and another terminal connected to the ground line; and an inverter having an input terminal connected to the trigger terminal and an output terminal connected to a second input terminal of the NAND gate.

Preferably, in the semiconductor integrated circuit device, the trigger terminal of the SCR protection circuit is connected to the ground line, and the trigger circuit includes: an n-transistor having one terminal connected to the power line and another terminal connected to the trigger terminal; a NOR gate having an output terminal connected to a gate of the n-transistor; a capacitor having one terminal connected to the ground line and another terminal connected to a first input terminal of the NOR gate; a third resistor having one terminal connected to the first input terminal of the NOR gate and another terminal connected to the power line; and a buffer having an input terminal connected to the trigger terminal and an output terminal connected to a second input terminal of the NOR gate.

Preferably, in the semiconductor integrated circuit device, the trigger terminal of the SCR protection circuit is connected to the power line, and the trigger circuit includes: a p-transistor having one terminal connected to the ground line and another terminal connected to the trigger terminal; a NAND gate having an output terminal connected to a gate of the p-transistor; a capacitor having one terminal connected to the power line and another terminal connected to a first input terminal of the NAND gate; a third resistor having one terminal connected to the first input terminal of the NAND gate and another terminal connected to the ground line; and a buffer having an input terminal connected to the trigger terminal and an output terminal connected to a second input terminal of the NAND gate.

Preferably, in the semiconductor integrated circuit device, the trigger terminal of the SCR protection circuit is connected to the power line, and the trigger circuit includes: an n-transistor having one terminal connected to the ground line and another terminal connected to the trigger terminal; a NOR gate having an output terminal connected to a gate of the n-transistor; a capacitor having one terminal connected to the ground line and another terminal connected to a first input terminal of the NOR gate; a third resistor having one terminal connected to the first input terminal of the NOR gate and another terminal connected to the power line; and an inverter having an input terminal connected to the trigger terminal and an output terminal connected to a second input terminal of the NOR gate.

The semiconductor integrated circuit device preferably further includes a component selected from the group consisting of: a diode connected in a reverse-bias direction between the power line and the ground line; an nMOS transistor having one terminal connected to the power line, another terminal connected to the ground line and a gate connected to the ground line; and a pMOS transistor having one terminal connected to the power line, another terminal connected to the ground line and a gate connected to the power line.

DETAILED DESCRIPTION OF THE INVENTION

Embodiment 1

A first embodiment of the present invention will be described with reference to the drawings.

Figure 1:
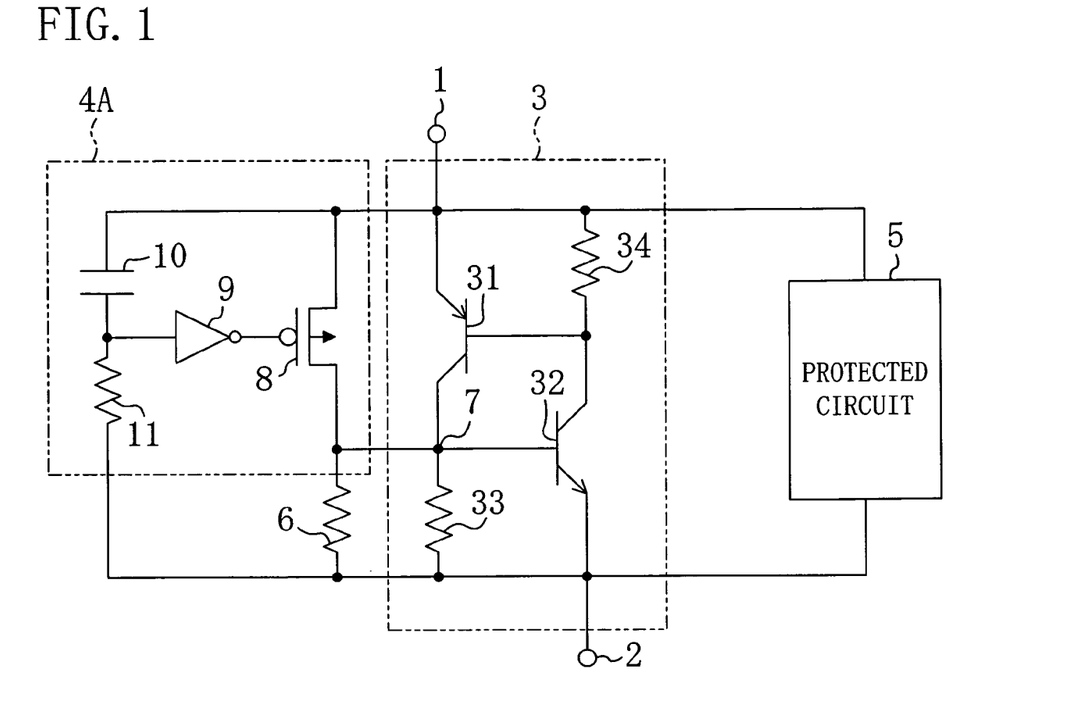
FIG. 1 is a circuit diagram illustrating a semiconductor integrated circuit device according to a first embodiment of the present invention.

FIG. 1 illustrates a circuit configuration of a semiconductor integrated circuit device according to the first embodiment. As illustrated in FIG. 1, the semiconductor integrated circuit device of the first embodiment includes: an SCR protection circuit 3 provided between a power line 1 and a ground line 2; a trigger circuit 4A connected in parallel with the SCR protection circuit 3; and a protected circuit 5 protected by the SCR protection circuit 3 and including a MOS transistor (not shown).

The SCR protection circuit 3 includes: a pnp bipolar transistor 31 having its emitter connected to the power line 1 and the collector connected to a first trigger terminal 7; an npn bipolar transistor 32 having its emitter connected to the ground line 2, the collector connected to the base of the pnp bipolar transistor 31 and the base connected to the first trigger terminal 7; a first resistor 33 having one terminal connected to the first trigger terminal 7 and the other terminal connected to the ground line 2; and a second resistor 34 having one terminal connected to the power line 1 and the other terminal connected to the collector of the npn bipolar transistor 32.

A third resistor 6 is connected between the first trigger terminal 7 in the SCR protection circuit 3 and the ground line 2.

The trigger circuit 4A includes: a pMOS transistor 8 having its source connected to the power line 1 and the drain connected to the first trigger terminal 7; an inverter 9 having its output terminal connected to the gate of the pMOS transistor 8; a capacitor 10 having one terminal connected to the power line 1 and the other terminal connected to an input terminal of the inverter 9; and a fourth resistor 11 having one terminal connected to the input terminal of the inverter 9 and the other terminal connected to the ground line 2.

In the first embodiment, when a surge of positive charge is applied to the power line 1 with the ground line 2 grounded, the trigger circuit 4A keeps the SCR protection circuit 3 in an ON state even if a voltage at the first trigger terminal 7 in the SCR protection circuit 3 is lower than the breakdown voltage of the gate oxide film of the MOS transistor included in the protected circuit 5. As a result, destruction of the gate oxide film of the MOS transistor included in the protected circuit 5 is prevented.

In this manner, a feature of the semiconductor integrated circuit device of the first embodiment is that the semiconductor integrated circuit device includes the trigger circuit 4A for controlling the ON voltage of the SCR protection circuit 3 under application of a positive surge to the SCR protection circuit 3.

Hereinafter, operation of the trigger circuit 4A will be specifically described.

In the semiconductor integrated circuit device illustrated in FIG. 1, the capacitor 10 is connected between the power line 1 and the inverter 9 in the trigger circuit 4A. Accordingly, when a surge of positive charge (e.g., 2000V) is applied to the power line 1 with the ground line 2 grounded during an ESD test, for example, the input potential of the inverter 9 in the trigger circuit 4A is increased by the fourth resistor 11 with the rise of the potential at the power line 1. When the increased input potential exceeds the switching level of the inverter 9, the inverter 9 outputs a low-level potential to the gate of the pMOS transistor 8. This low-level potential turns the pMOS transistor 8 in the trigger circuit 4A ON, so that the power line 1 and the first trigger terminal 7 become conductive, and the voltage at the first trigger terminal 7 is increased by the first resistor 33 and the third resistor 6. Because of the increase of the voltage at the first trigger terminal 7, when the potential difference between the first trigger terminal 7 and the ground line 2 exceeds the built-in voltage of a diode in a so-called thyristor forming the SCR protection circuit 3, base current (SCR trigger current) flowing from the first trigger terminal 7 to the ground line 2 occurs in the npn bipolar transistor 32. This SCR trigger current makes the npn bipolar transistor 32 and the pnp bipolar transistor 31 conductive, so that the SCR protection circuit 3 turns ON. Accordingly, the flow of current (latch-up phenomenon) is maintained with a very low ON resistance (e.g., 1 Ω) between the anode (i.e., the emitter of the pnp bipolar transistor 31) and the cathode (i.e., the emitter of the npn bipolar transistor 32) in the SCR protection circuit 3.

At this time, since the third resistor 6 is provided between the pMOS transistor 8 and the ground line 2 and this third resistor 6 and the first resistor 33 are connected in parallel with each other, the resistance value between the first trigger terminal 7 and the ground line 2 is lower than that in a case in which the third resistor 6 is not provided. Accordingly, the ON current of the pMOS transistor 8 flows through the first resistor 33 and the third resistor 6, so that the SCR protection circuit 3 is allowed to turn ON at a voltage (e.g., 3V) lower than the breakdown voltage (e.g., 5V) of the gate oxide film of the MOS transistor included in the protected circuit 5. This further ensures protection of the protected circuit 5 against a surge entering through the power line 1 from outside the device.

MODIFIED EXAMPLE 1 OF EMBODIMENT 1

Figure 2:
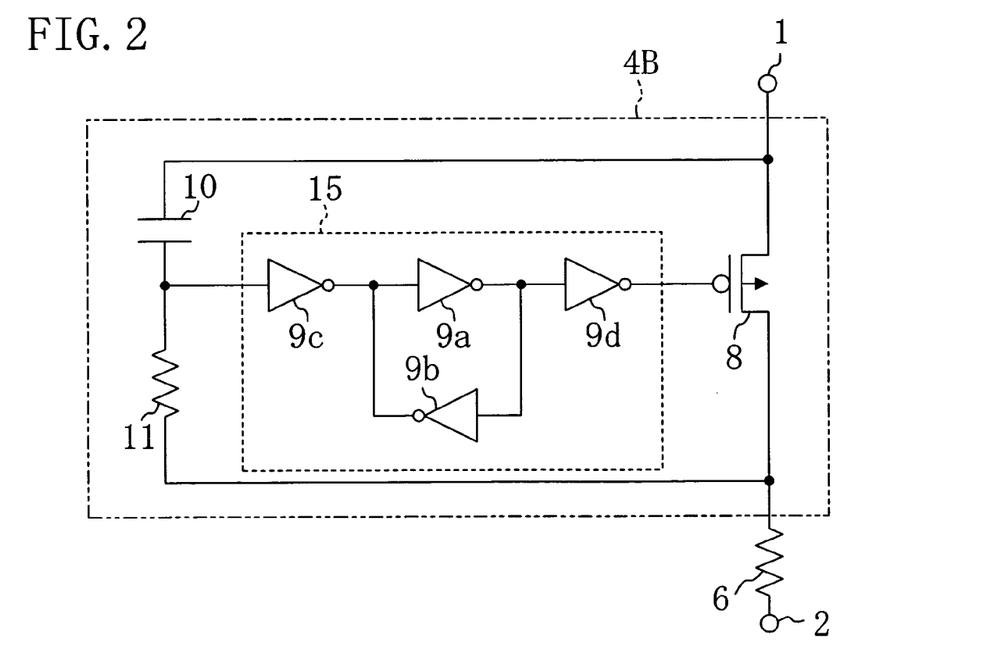
FIG. 2 is a circuit diagram illustrating a trigger circuit forming a semiconductor integrated circuit device according to a first modified example of the first embodiment.

FIG. 2 illustrates a trigger circuit in a semiconductor integrated circuit device according to a first modified example of the first embodiment. In FIG. 2, components already shown in FIG. 1 are denoted by the same numerals, and the description thereof will be omitted.

As illustrated in FIG. 2, a trigger circuit 4B according to this modified example includes a Schmitt trigger circuit 15 including, for example, a bistable circuit formed by two inverters 9a and 9b connected to form a flip-flop and inverters 9c and 9d connected to the input terminal and the output terminal, respectively, of the bistable circuit, instead of one inverter for applying a control voltage to the gate of the pMOS transistor 8.

In this manner, the Schmitt trigger circuit 15 prevents malfunction (latch-up) of the SCR protection circuit caused by power noise during normal operation.

MODIFIED EXAMPLE 2 OF EMBODIMENT 1

Figure 3:
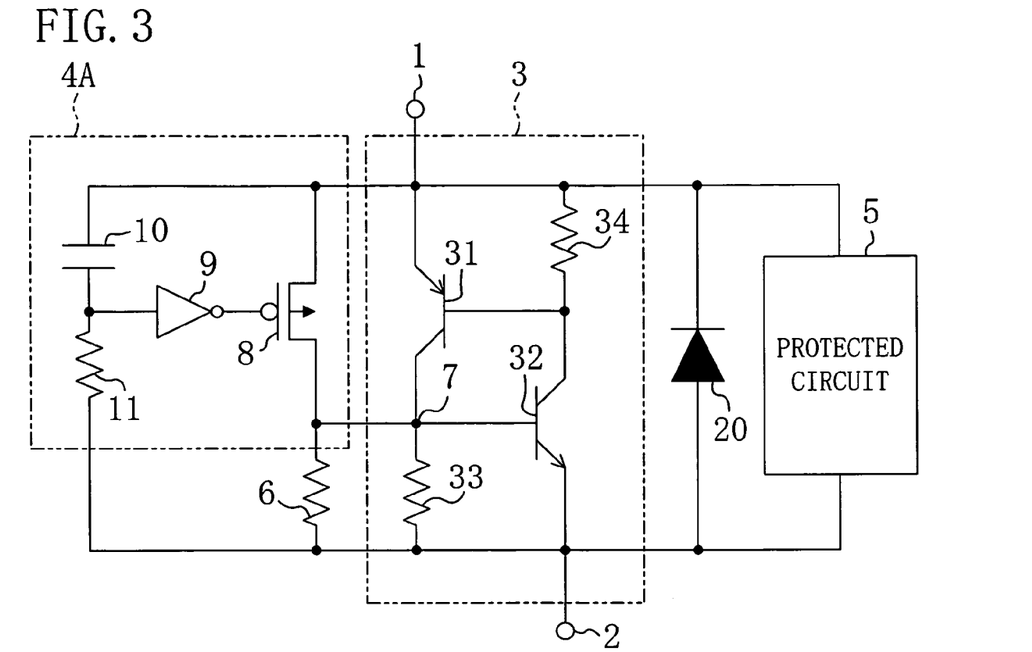
FIG. 3 is a circuit diagram illustrating a semiconductor integrated circuit device according to a second modified example of the first embodiment.

FIG. 3 illustrates a semiconductor integrated circuit device according to a second modified example of the first embodiment. In FIG. 3, components already shown in FIG. 1 are denoted by the same numerals, and the description thereof will be omitted.

As illustrated in FIG. 3, the semiconductor integrated circuit device of the second modified example includes a pn diode 20 connected in parallel with the protected circuit 5 and having its cathode connected to the power line 1 and the anode connected to the ground line 2.

With this configuration, even when a surge of positive charge is applied to the ground line 2 with the power line 1 grounded, a positive bias voltage is applied to the pn diode 20, so that the power line 1 and the ground line 2 become conductive. Accordingly, surge charge is discharged from the ground line 2 to the power line 1. As a result, even when a surge of positive charge is applied to the ground line 2, destruction of the gate oxide film of the MOS transistor included in the protected circuit 5 is prevented.

MODIFIED EXAMPLE 3 OF EMBODIMENT 1

Figure 4:
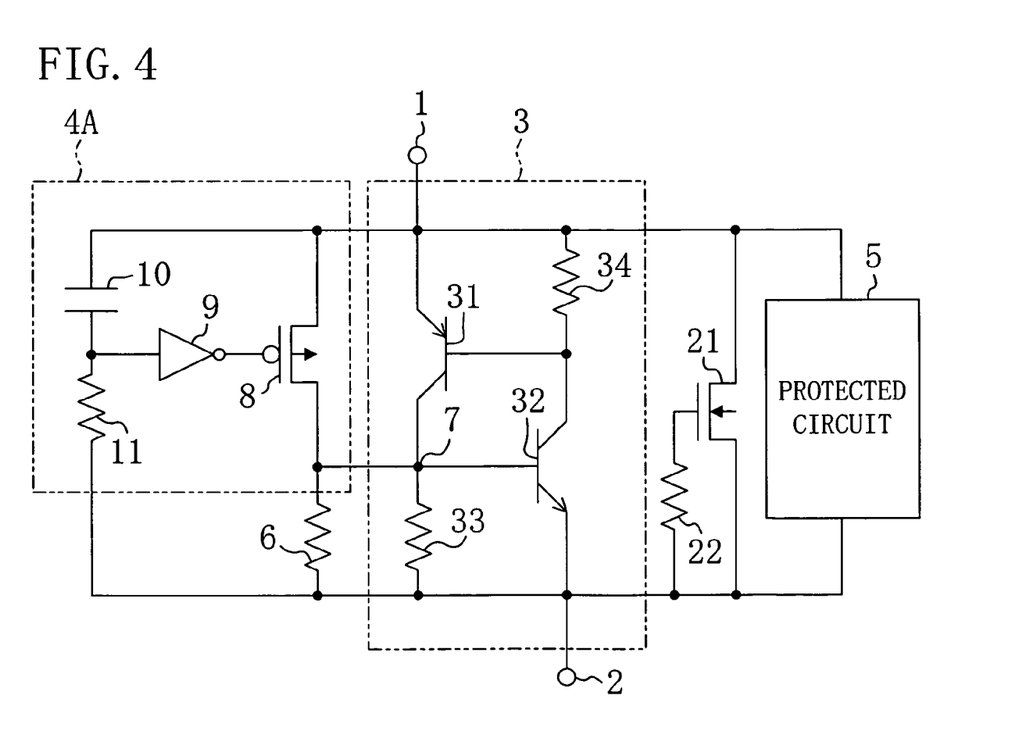
FIG. 4 is a circuit diagram illustrating a semiconductor integrated circuit device according to a third modified example of the first embodiment.

FIG. 4 illustrates a semiconductor integrated circuit device according to a third modified example of the first embodiment. In FIG. 4, components already shown in FIG. 1 are denoted by the same numerals, and the description thereof will be omitted.

As illustrated in FIG. 4, the semiconductor integrated circuit device of the third modified example include an nMOS transistor 21 connected in parallel with a protected circuit 5 and having its drain connected to a power line 1, the source connected to a ground line 2 and the gate connected to the ground line 2 through a resistor 22.

With this configuration, even when a surge of positive charge is applied to the ground line 2 with the power line 1 grounded, the nMOS transistor 21 is turned ON by application of a voltage exceeding the threshold voltage of the nMOS transistor 21 to the gate of the NMOS transistor 21, so that the power line 1 and the ground line 2 become conductive. Accordingly, surge charge is discharged from the ground line 2 to the power line 1. As a result, even when a surge of positive charge is applied to the ground line 2, destruction of the gate oxide film of the MOS transistor included in the protected circuit 5 is prevented.

MODIFIED EXAMPLE 4 OF EMBODIMENT 1

Figure 5:
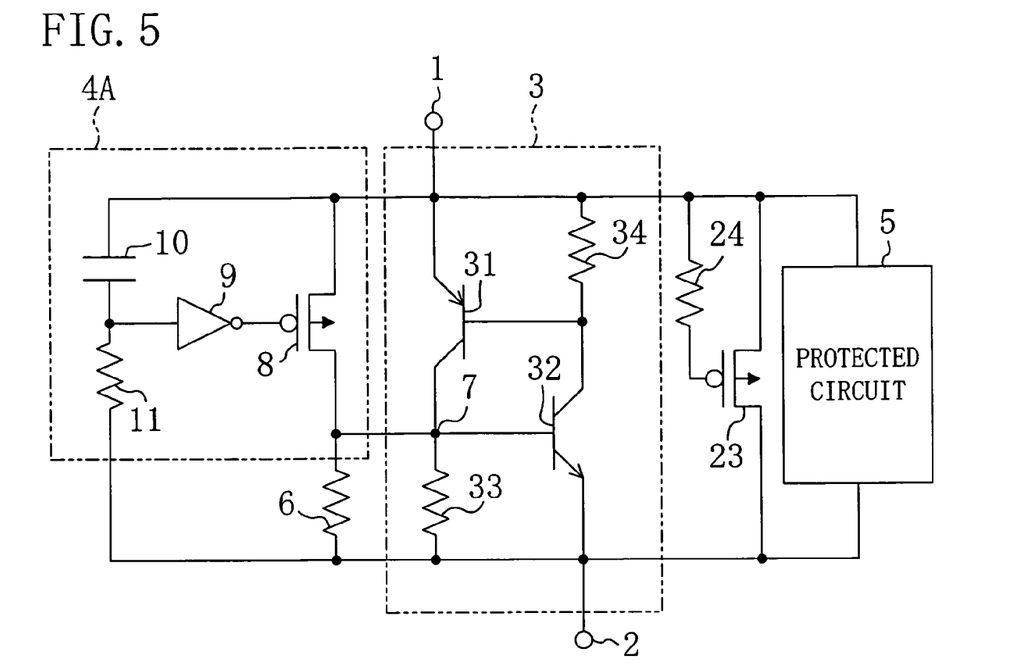
FIG. 5 is a circuit diagram illustrating a semiconductor integrated circuit device according to a fourth modified example of the first embodiment.

FIG. 5 illustrates a semiconductor integrated circuit device according to a fourth modified example of the first embodiment. In FIG. 5, components already shown in FIG. 1 are denoted by the same numerals, and the description thereof will be omitted.

As illustrated in FIG. 5, the semiconductor integrated circuit device of the fourth modified example includes a pMOS transistor 23 connected in parallel with a protected circuit 5 and having its source connected to a power line 1, the drain connected to a ground line 2, and the gate connected to the power line 1 through a resistor 24.

With this configuration, even when a surge of positive charge is applied to the ground line 2 with the power line 1 grounded, the pMOS transistor 23 is turned ON by application of a voltage exceeding the threshold voltage of the pMOS transistor 23 to the gate of the pMOS transistor 23, so that the power line 1 and the ground line 2 become conductive. Accordingly, surge charge is discharged from the ground line 2 to the power line 1. As a result, even when a surge of positive charge is applied to the ground line 2, destruction of the gate oxide film of the MOS transistor included in the protected circuit 5 is prevented.

Embodiment 2

Hereinafter, a second embodiment of the present invention will be described with reference to the drawings.

Figure 6:
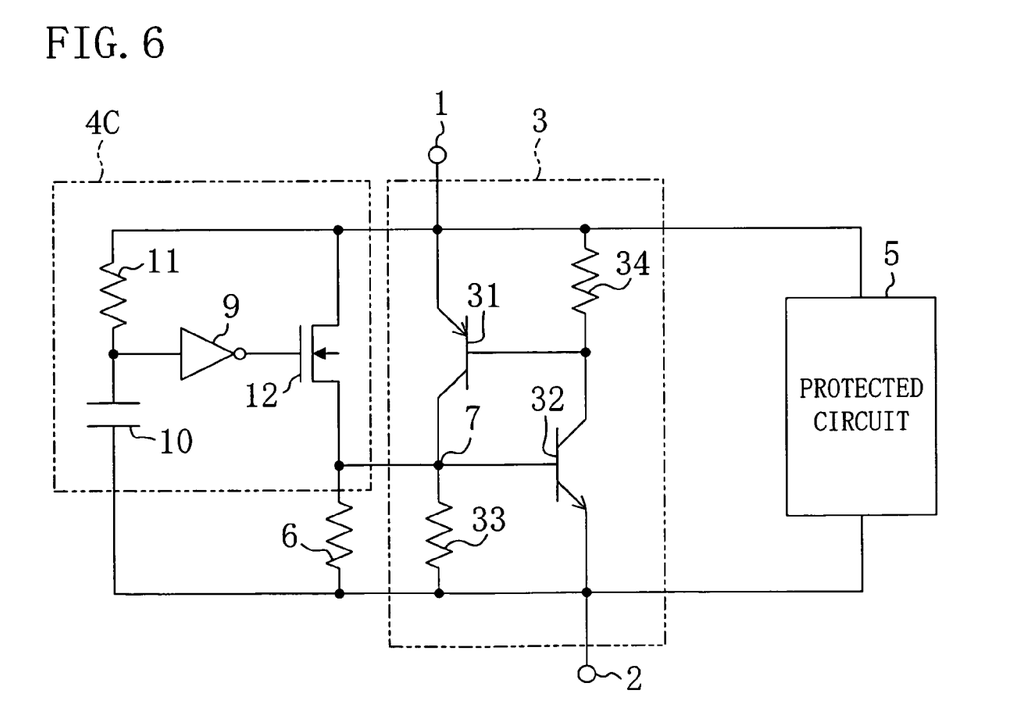
FIG. 6 is a circuit diagram illustrating a semiconductor integrated circuit device according to a second embodiment of the present invention.

FIG. 6 illustrates a circuit configuration of a semiconductor integrated circuit device according to the second embodiment. In FIG. 6, components also shown in FIG. 1 are denoted by the same reference numerals, and description thereof will be omitted.

As illustrated in FIG. 6, in the semiconductor integrated circuit device of the second embodiment, an nMOS transistor 12 having its drain connected to a power line 1 and the source connected to a first trigger terminal 7 is used, as a MOS transistor for generating SCR trigger current, in a trigger circuit 4C. In addition, a capacitor 10 is connected between a ground line 2 and the input terminal of an inverter 9, and a fourth resistor 11 is connected between the power line 1 and the input terminal of the inverter 9.

Hereinafter, operation of the trigger circuit 4C will be specifically described.

In the semiconductor integrated circuit device illustrated in FIG. 6, the capacitor 10 is connected between the ground line 2 and the inverter 9 in the trigger circuit 4C. Accordingly, when a surge of positive charge is applied to the power line 1 with the ground line 2 grounded during an ESD test, for example, the potential at the input potential of the inverter 9 in the trigger circuit 4C is reduced by the fourth resistor 11 though the potential at the power line 1 rises. When the reduced input potential goes below the switching level of the inverter 9, the inverter 9 outputs a high-level potential to the gate of the NMOS transistor 12. This high-level potential turns the nMOS transistor 12 in the trigger circuit 4C ON, so that the power line 1 and the first trigger terminal 7 become conductive, and the voltage at the first trigger terminal 7 is increased by a first resistor 33 and a third resistor 6. With the increase of the voltage at the first trigger terminal 7, when the potential difference between the first trigger terminal 7 and the ground line 2 exceeds the built-in voltage of a diode in the SCR protection circuit 3, base current (SCR trigger current) flowing from the first trigger terminal 7 to the ground line 2 occurs in an npn bipolar transistor 32. This SCR trigger current makes the npn bipolar transistor 32 and a pnp bipolar transistor 31 conductive, so that the SCR protection circuit 3 turns ON. Accordingly, the flow of current (latch-up phenomenon) is maintained with a very low ON resistance between the anode (i.e., the emitter of the pnp bipolar transistor 31) and the cathode (i.e., the emitter of the npn bipolar transistor 32) in the SCR protection circuit 3.

At this time, since the third resistor 6 is provided between the NMOS transistor 12 and the ground line 2, the ON current of the nMOS transistor 12 flows through the first resistor 33 and the third resistor 6, so that the SCR protection circuit 3 is allowed to turn ON at a voltage lower than the breakdown voltage of the gate oxide film of a MOS transistor included in a protected circuit 5. This further ensures protection of the protected circuit 5 against a surge entering through the power line 1 from outside the device.

Embodiment 3

Hereinafter, a third embodiment of the present invention will be described with reference to the drawings.

Figure 7:
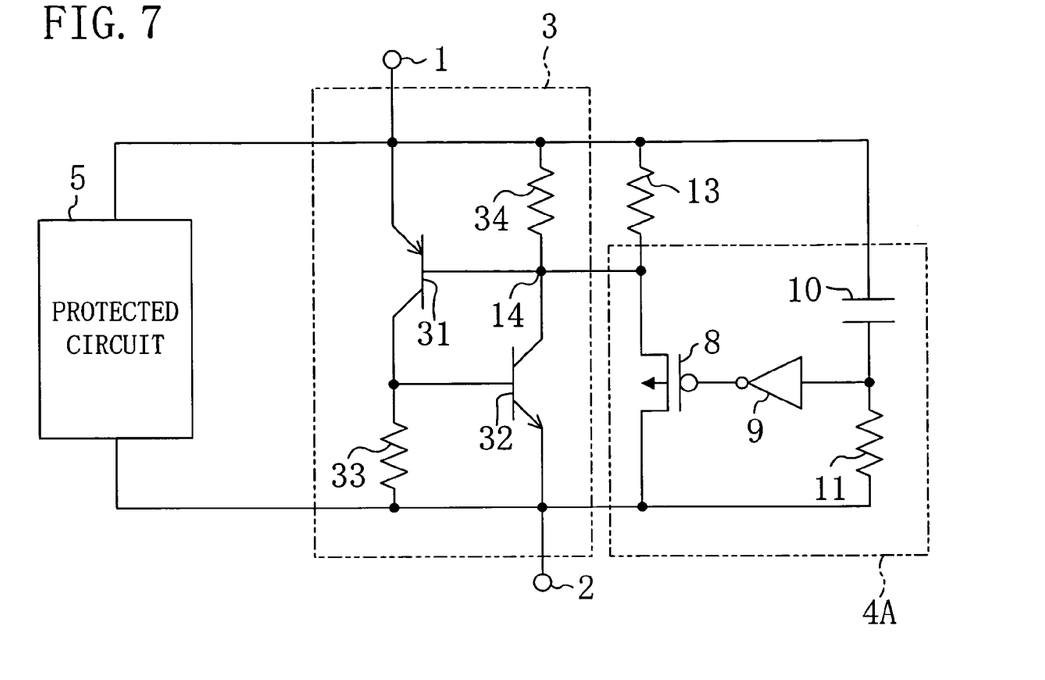
FIG. 7 is a circuit diagram illustrating a semiconductor integrated circuit device according to a third embodiment of the present invention.

FIG. 7 illustrates a circuit configuration of a semiconductor integrated circuit device according to the third embodiment. In FIG. 7, components also shown in FIG. 1 are denoted by the same reference numerals, and description thereof will be omitted.

As illustrated in FIG. 7, in a trigger circuit 4A according to the third embodiment, the source of a pMOS transistor 8 is connected to a second trigger terminal 14 as a connection node between the base of a pnp bipolar transistor 31 and the collector of an npn bipolar transistor 32 in an SCR protection circuit 3 and the drain of the pMOS transistor 8 is connected to a ground line 2. In addition, a fifth resistor 13 is connected between the second trigger terminal 14 in the SCR protection circuit 3 and a power line 1.

Hereinafter, operation of the trigger circuit 4A of the third embodiment will be described.

In the semiconductor integrated circuit device illustrated in FIG. 7, a capacitor 10 is connected between the power line 1 and an inverter 9 in the trigger circuit 4A. Accordingly, when a surge of positive charge is applied to the power line 1 with the ground line 2 grounded during an ESD test, for example, the input potential of the inverter 9 in the trigger circuit 4A is increased by a fourth resistor 11 with the rise of the potential at the power line 1. When the increased input potential exceeds the switching level of the inverter 9, the inverter 9 outputs a low-level potential to the gate of the pMOS transistor 8. This low-level potential turns the pMOS transistor 8 in the trigger circuit 4A ON, so that the ground line 2 and the second trigger terminal 14 become conductive, and the voltage at the second trigger terminal 14 drops. Because of the drop of the voltage at the second trigger terminal 14, when the potential difference between the second trigger terminal 14 and the power line 1 exceeds the built-in voltage of a diode in the SCR protection circuit 3, base current (SCR trigger current) flowing from the power line 1 to the second trigger terminal 14 occurs in the pnp bipolar transistor 31. This SCR trigger current makes the pnp bipolar transistor 31 and the npn bipolar transistor 32 conductive, so that the SCR protection circuit 3 turns ON. Accordingly, the flow of current (latch-up phenomenon) is maintained with a very low ON resistance between the anode (i.e., the emitter of the pnp bipolar transistor 31) and the cathode (i.e., the emitter of the npn bipolar transistor 32) in the SCR protection circuit 3.

At this time, since the fifth resistor 13 is provided between the pMOS transistor 8 and the power line 1, the ON current of the pMOS transistor 8 flows in the second resistor 34 and the fifth resistor 13, so that the SCR protection circuit 3 is allowed to turn ON at a voltage lower than the breakdown voltage of the gate oxide film of a MOS transistor included in a protected circuit 5. This further ensures protection of the protected circuit 5 against a surge entering through the power line 1 from outside the device.

Embodiment 4

Hereinafter, a fourth embodiment of the present invention will be described with reference to the drawings.

Figure 8:
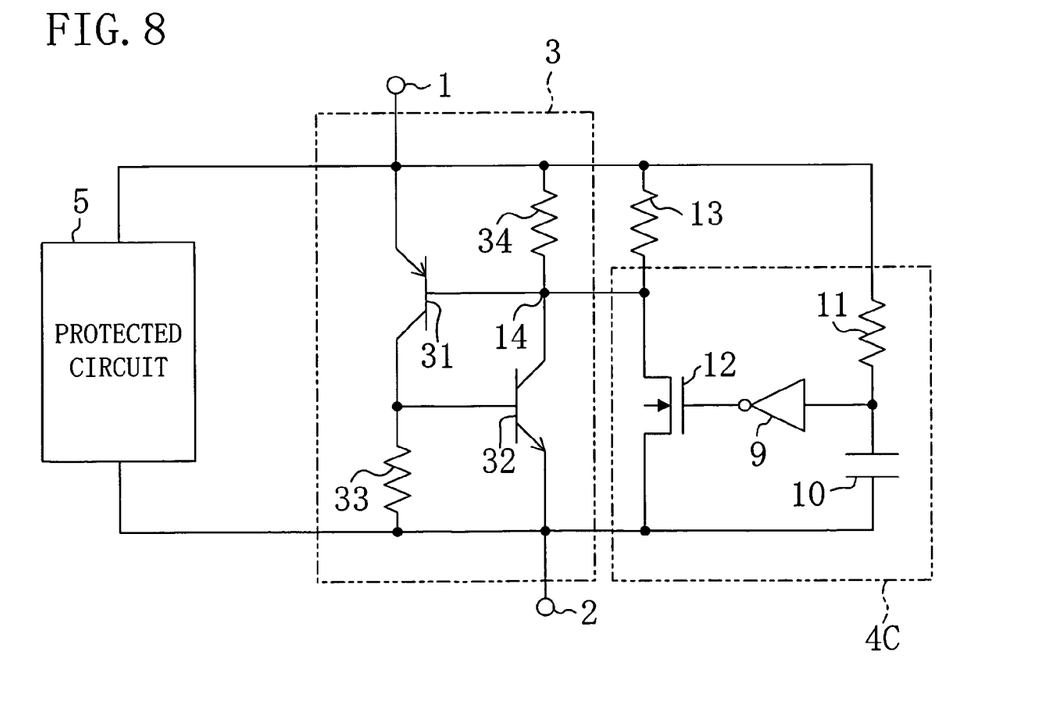
FIG. 8 is a circuit diagram illustrating a semiconductor integrated circuit device according to a fourth embodiment of the present invention.

FIG. 8 illustrates a circuit configuration of a semiconductor integrated circuit device according to the fourth embodiment. In FIG. 8, components also shown in FIG. 7 are denoted by the same reference numerals, and description thereof will be omitted.

As illustrated in FIG. 8, in the semiconductor integrated circuit device of the fourth embodiment, an NMOS transistor 12 having its source connected to a ground line 2 and the drain connected to a second trigger terminal 14 is used in a trigger circuit 4C. In addition, a capacitor 10 is connected between the ground line 2 and the input terminal of an inverter 9. A fourth resistor 11 is connected between a power line 1 and the input terminal of the inverter 9.

Hereinafter, operation of the trigger circuit 4C will be described.

In the semiconductor integrated circuit device illustrated in FIG. 8, the capacitor 10 is connected between the ground line 2 and the inverter 9 in the trigger circuit 4C. Accordingly, when a surge of positive charge is applied to the power line 1 with the ground line 2 grounded during an ESD test, for example, the input potential of the inverter 9 in the trigger circuit 4C is reduced by the fourth resistor 11 though the potential at the power line 1 rises. When the reduced input potential goes below the switching level of the inverter 9, the inverter 9 outputs a high-level potential to the gate of the NMOS transistor 12. This high-level potential turns the nMOS transistor 12 in the trigger circuit 4C ON, so that the ground line 2 and the second trigger terminal 14 become conductive, and the voltage at the second trigger terminal 14 drops. Because of the drop of the voltage at the second trigger terminal 14, when the potential difference between the second trigger terminal 14 and the power line 1 exceeds the built-in voltage of a diode in the SCR protection circuit 3, base current (SCR trigger current) flowing from the power line 1 to the second trigger terminal 14 occurs in a pnp bipolar transistor 31. This SCR trigger current makes the pnp bipolar transistor 31 and an npn bipolar transistor 32 conductive, so that the SCR protection circuit 3 turns ON. Accordingly, the flow of current (latch-up phenomenon) is maintained with a very low ON resistance between the anode (i.e., the emitter of the pnp bipolar transistor 31) and the cathode (i.e., the emitter of the npn bipolar transistor 32) in the SCR protection circuit 3.

At this time, since a fifth resistor 13 is provided between the nMOS transistor 12 and the power line 1, the ON current of the nMOS transistor 12 flows through a second resistor 34 and the fifth resistor 13, so that the SCR protection circuit 3 is allowed to turn ON at a voltage lower than the breakdown voltage of the gate oxide film of a MOS transistor included in a protected circuit 5. This further ensures protection of the protected circuit 5 against a surge entering through the power line 1 from outside the device.

In the second through fourth embodiments, a Schmitt trigger circuit 15 may be used instead of the inverter 9, as in the example of the first embodiment.

Embodiment 5

Hereinafter, a fifth embodiment of the present invention will be described with reference to the drawings.

Figure 9:
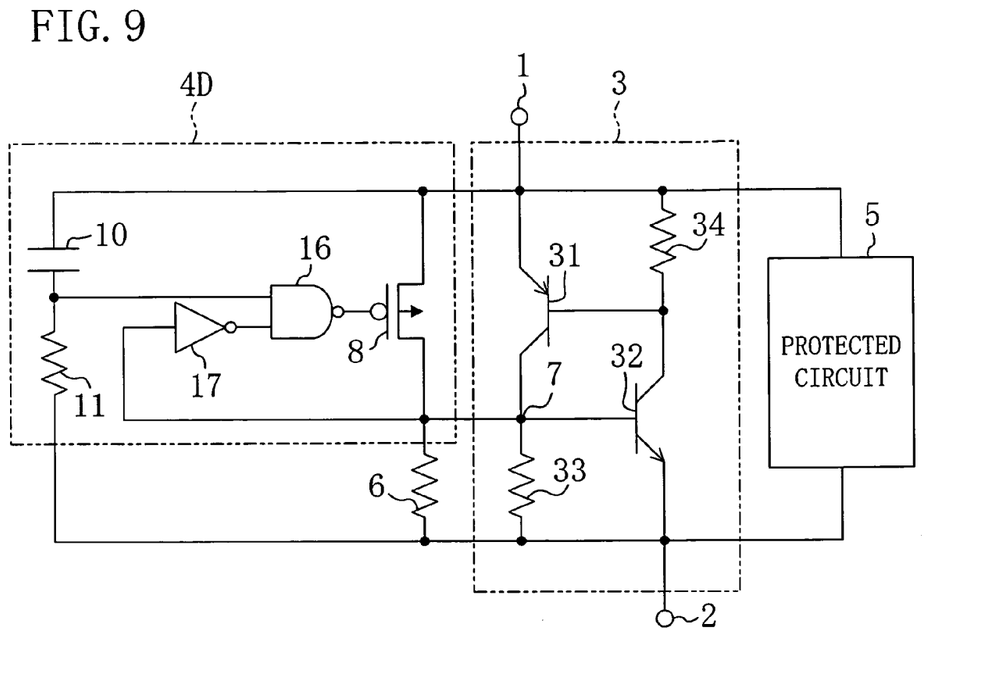
FIG. 9 is a circuit diagram illustrating a semiconductor integrated circuit device according to a fifth embodiment of the present invention.

FIG. 9 illustrates a circuit configuration of a semiconductor integrated circuit device according to the fifth embodiment. In FIG. 9, components also shown in FIG. 1 are denoted by the same reference numerals, and description thereof will be omitted.

As illustrated in FIG. 9, the semiconductor integrated circuit device of the fifth embodiment includes, in a trigger circuit 4D, a NAND gate 16 and an inverter 17, instead of one inverter for applying a control voltage to the gate of a pMOS transistor 8. The NAND gate 16 has a first input terminal connected to a connection node between a capacitor 10 and a fourth resistor 11 and a second input terminal receiving an output from the inverter 17. The inverter 17 has its input terminal connected to the drain of the pMOS transistor 8, i.e., a first trigger terminal 7.

Hereinafter, operation of the trigger circuit 4D will be described.

In the semiconductor integrated circuit device illustrated in FIG. 9, the capacitor 10 is connected between a power line 1 and the NAND gate 16 in the trigger circuit 4D. Accordingly, when a surge of positive charge is applied to the power line 1 with a ground line 2 grounded during an ESD test, for example, the potential at the first input terminal of the NAND gate 16 in the trigger circuit 4D is increased by the fourth resistor 11 as the potential at the power line 1 rises. At this time, since the input terminal of the inverter 17 is connected to the ground line 2 through a third resistor 6 and the potential at this input terminal is at a low level, the potential at the second input terminal of the NAND gate 16, on the other hand, is at a high level. Accordingly, when the potential at the first input terminal exceeds the switching level of the NAND gate 16, the NAND gate 16 outputs a low-level potential to the gate of the pMOS transistor 8. This low-level potential turns the pMOS transistor 8 in the trigger circuit 4D ON, so that the power line 1 and the first trigger terminal 7 become conductive, and the voltage at the first trigger terminal 7 is increased by a first resistor 33 and a third resistor 6. Because of the increase of the voltage at the first trigger terminal 7, when the potential difference between the first trigger terminal 7 and the ground line 2 exceeds the built-in voltage of a diode in an SCR protection circuit 3, base current (SCR trigger current) flowing from the first trigger terminal 7 to the ground line 2 occurs in an npn bipolar transistor 32. This SCR trigger current makes the npn bipolar transistor 32 and a pnp bipolar transistor 31 conductive, so that the SCR protection circuit 3 turns ON. Accordingly, the flow of current (latch-up phenomenon) is maintained with a very low ON resistance between the anode (i.e., the emitter of the pnp bipolar transistor 31) and the cathode (i.e., the emitter of the npn bipolar transistor 32) in the SCR protection circuit 3.

At this time, since the third resistor 6 is provided between the pMOS transistor 8 and the ground line 2, the ON current of the pMOS transistor 8 flows through the first resistor 33 and the third resistor 6, so that the SCR protection circuit 3 is allowed to turn ON at a voltage lower than the breakdown voltage of the gate oxide film of a MOS transistor included in a protected circuit 5.

In addition, in the fifth embodiment, when the potential at the first trigger terminal 7 rises to exceed the switching level of the inverter 17, the inverter 17 outputs a low-level potential, so that the output value of the NAND gate 16 switches from a low level to a high level. Accordingly, the pMOS transistor 8 receiving the high-level potential at its gate changes to an OFF state, so that current flowing from the power line 1 to the first trigger terminal 7 through the pMOS transistor 8 is interrupted. As a result, excessive current flowing through the pMOS transistor 8 is blocked, so that destruction caused by a surge in the pMOS transistor 8 is prevented.

In this manner, in the fifth embodiment, not only the protected circuit 5 but also the trigger circuit 4D is protected against a surge entering from outside the device through the power line 1.

Embodiment 6

Hereinafter, a sixth embodiment of the present invention will be described with reference to the drawings.

Figure 10:
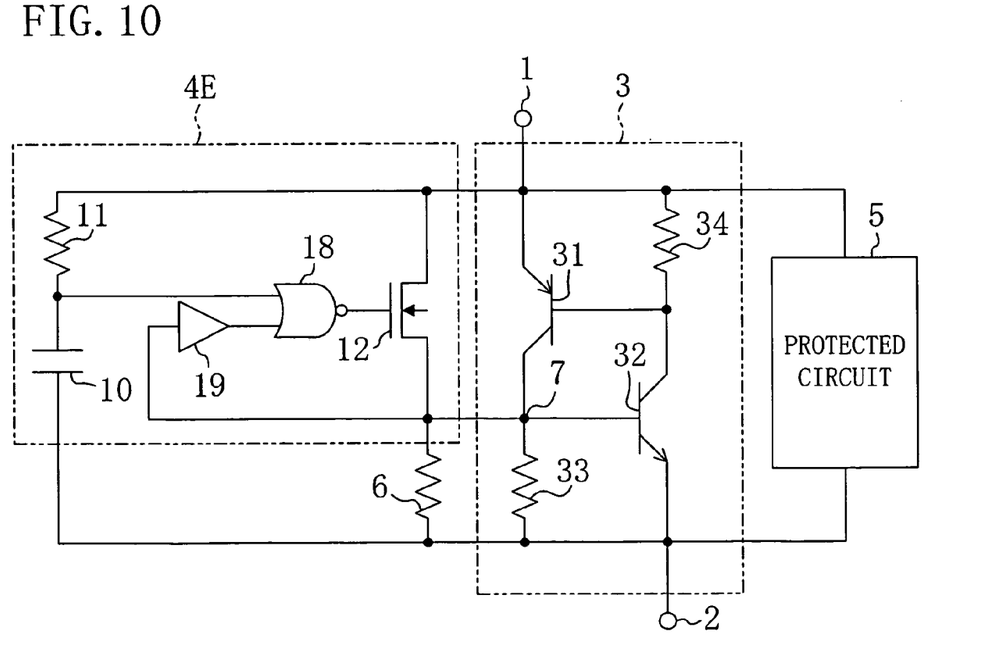
FIG. 10 is a circuit diagram illustrating a semiconductor integrated circuit device according to a sixth embodiment of the present invention.

FIG. 10 illustrates a circuit configuration of a semiconductor integrated circuit device according to the sixth embodiment. In FIG. 10, components also shown in FIG. 6 are denoted by the same reference numerals, and description thereof will be omitted.

As illustrated in FIG. 10, the semiconductor integrated circuit device of the sixth embodiment includes, in a trigger circuit 4E, a NOR gate 18 and a buffer 19 are used, instead of one inverter for applying a control voltage to the gate of an NMOS transistor 12. The NOR gate 18 has a first input terminal connected to a connection node between a capacitor 10 and a fourth resistor 11 and a second input terminal receiving an output from the buffer 19. The buffer 19 has its input terminal connected to the source of the NMOS transistor 12, i.e., a first trigger terminal 7.

Hereinafter, operation of the trigger circuit 4E will be described.

In the semiconductor integrated circuit device illustrated in FIG. 10, the capacitor 10 is connected between the ground line 2 and the NOR gate 18 in the trigger circuit 4E. Accordingly, when a surge of positive charge is applied to the power line 1 with the ground line 2 grounded during an ESD test, for example, the potential at the first input terminal of the NOR gate 18 in the trigger circuit 4E is reduced by the fourth resistor 11 though the potential at the power line 1 rises. At this time, since the input terminal of the buffer 19 is connected to the ground line 2 through a third resistor 6 and is at a low level, the potential at the second input terminal of the NOR gate 18 is also at a low level. Accordingly, when the potential at the first input terminal goes below the switching level of the NOR gate 18, the NOR gate 18 outputs a high-level potential to the gate of the nMOS transistor 12. This high-level potential turns the NMOS transistor 12 in the trigger circuit 4E ON, so that the power line 1 and the first trigger terminal 7 become conductive, and the voltage at the first trigger terminal 7 is increased by a first resistor 33 and the third resistor 6. Because of the increase of the voltage at the first trigger terminal 7, when the potential difference between the first trigger terminal 7 and the ground line 2 exceeds the built-in voltage of a diode in an SCR protection circuit 3, base current (SCR trigger current) flowing from the first trigger terminal 7 to the ground line 2 occurs in an npn bipolar transistor 32. This SCR trigger current makes the npn bipolar transistor 32 and a pnp bipolar transistor 31 conductive, so that the SCR protection circuit 3 turns ON. Accordingly, the flow of current (latch-up phenomenon) is maintained with a very low ON resistance between the anode (i.e., the emitter of the pnp bipolar transistor 31) and the cathode (i.e., the emitter of the npn bipolar transistor 32) in the SCR protection circuit 3.

At this time, since the third resistor 6 is provided between the nMOS transistor 12 and the ground line 2, the ON current of the nMOS transistor 12 flows through the first resistor 33 and the third resistor 6, so that the SCR protection circuit 3 is allowed to turn ON at a voltage lower than the breakdown voltage of the gate oxide film of a MOS transistor included in a protected circuit 5.

In addition, in the sixth embodiment, when the potential at the first trigger terminal 7 rises to exceed the switching level of the buffer 19, the buffer 19 outputs a high-level potential, so that the output value of the NOR gate 18 switches from a high level to a low level. Accordingly, the NMOS transistor 12 receiving the low-level potential at its gate changes to an OFF state, so that current flowing from the power line 1 to the first trigger terminal 7 through the nMOS transistor 12 is interrupted. As a result, excessive current flowing through the NMOS transistor 12 is blocked, so that destruction caused by a surge in the nMOS transistor 12 is prevented.

In this manner, in the sixth embodiment, not only the protected circuit 5 but also the trigger circuit 4E is protected against a surge entering from outside the device through the power line 1.

Embodiment 7

Hereinafter, a seventh embodiment of the present invention will be described with reference to the drawings.

Figure 11:
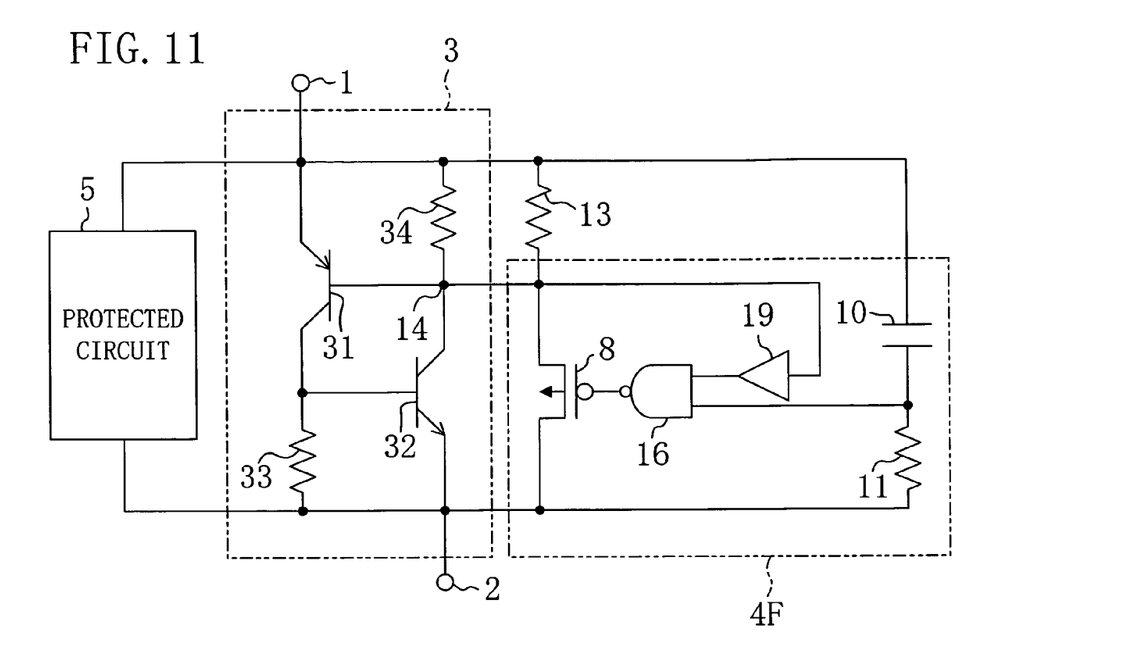
FIG. 11 is a circuit diagram illustrating a semiconductor integrated circuit device according to a seventh embodiment of the present invention.

FIG. 11 illustrates a circuit configuration of a semiconductor integrated circuit device according to the seventh embodiment. In FIG. 11, components also shown in FIG. 7 are denoted by the same reference numerals, and description thereof will be omitted.

As illustrated in FIG. 11, the semiconductor integrated circuit device of the seventh embodiment includes, in a trigger circuit 4F, a NAND gate 16 and a buffer 19, instead of one inverter for applying a control voltage to the gate of a pMOS transistor 8. The NAND gate 16 has a first input terminal connected to a connection node between a capacitor 10 and a fourth resistor 11 and a second input terminal receiving an output from the buffer 19. The buffer 19 has its input terminal connected to the source of the pMOS transistor 8, i.e., a second trigger terminal 14.

Hereinafter, operation of the trigger circuit 4F will be described.

In the semiconductor integrated circuit device illustrated in FIG. 11, the capacitor 10 is connected between a power line 1 and the first input terminal of the NAND gate 16 in the trigger circuit 4F. Accordingly, when a surge of positive charge is applied to the power line 1 with a ground line 2 grounded during an ESD test, for example, the potential at the first input terminal of the NAND gate 16 in the trigger circuit 4F is increased by the fourth resistor 11 as the potential at the power line 1 rises. At this time, since the input terminal of the buffer 19 is connected to the power line 1 through a fifth resistor 13, the potential at the second input terminal of the NAND gate 16 is at a high level. Accordingly, when the potential at the first input terminal exceeds the switching level of the NAND gate 16, the NAND gate 16 outputs a low-level potential to the gate of the pMOS transistor 8. This low-level potential turns the pMOS transistor 8 in the trigger circuit 4F ON, so that the second trigger terminal 14 and the ground line 2 become conductive, and the voltage at the second trigger terminal 14 drops. Because of the drop of the voltage at the second trigger terminal 14, when the potential difference between the second trigger terminal 14 and the power line 1 exceeds the built-in voltage of a diode in an SCR protection circuit 3, base current (SCR trigger current) flowing from the power line 1 to the second trigger terminal 14 occurs in a pnp bipolar transistor 31. This SCR trigger current makes the pnp bipolar transistor 31 and an npn bipolar transistor 32 conductive, so that the SCR protection circuit 3 turns ON. Accordingly, the flow of current (latch-up phenomenon) is maintained with a very low ON resistance between the anode (i.e., the emitter of the pnp bipolar transistor 31) and the cathode (i.e., the emitter of the npn bipolar transistor 32) in the SCR protection circuit 3.

At this time, since the fifth resistor 13 is provided between the pMOS transistor 8 and the power line 1, the ON current of the pMOS transistor 8 flows through a second resistor 34 and the fifth resistor 13, so that the SCR protection circuit 3 is allowed to turn ON at a voltage lower than the breakdown voltage of the gate oxide film of a MOS transistor included in a protected circuit 5.

In addition, in the seventh embodiment, when the potential at the second trigger terminal 14 goes below the switching level of the buffer 19, the buffer 19 outputs a low-level potential, so that the output value of the NAND gate 16 switches from a low level to a high level. Accordingly, the pMOS transistor 8 receiving the high-level potential at its gate changes to an OFF state, so that current flowing from the power line 1 to the ground line 2 through the pMOS transistor 8 is interrupted. As a result, excessive current flowing through the pMOS transistor 8 is blocked, so that destruction caused by a surge in the pMOS transistor 8 is prevented.

In this manner, in the seventh embodiment, not only the protected circuit 5 but also the trigger circuit 4F is protected against a surge entering from outside the device through the power line 1.

Embodiment 8

Hereinafter, an eighth embodiment of the present invention will be described with reference to the drawings.

Figure 12:
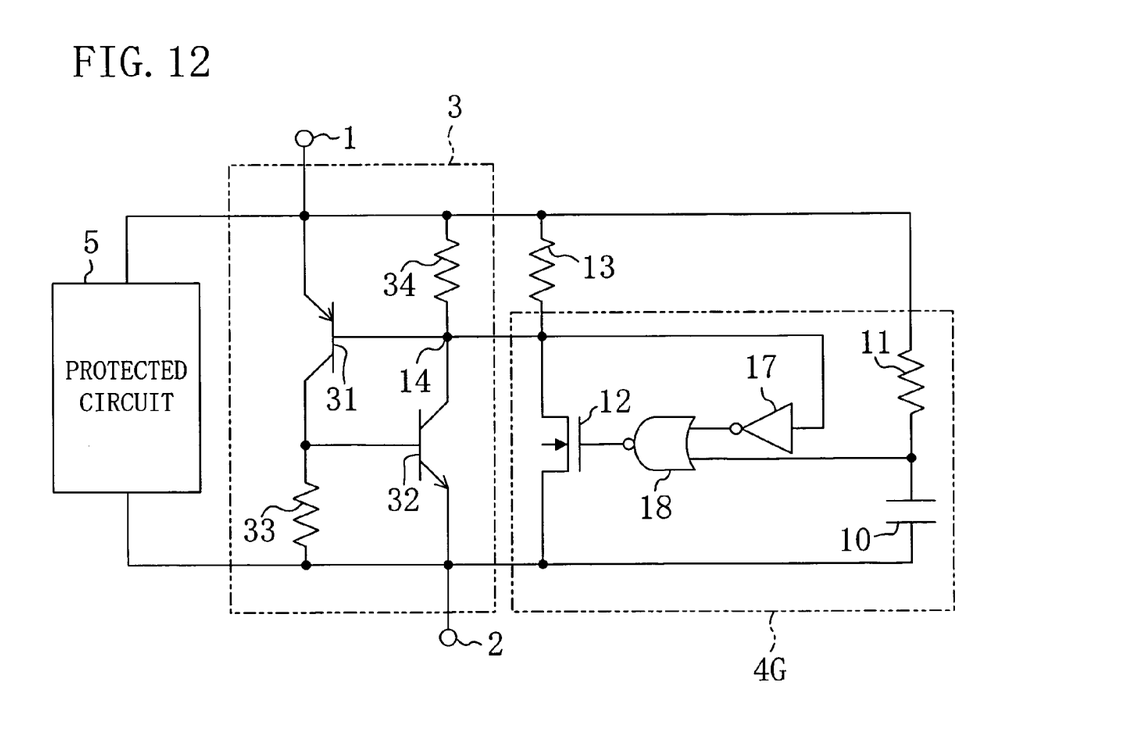
FIG. 12 is a circuit diagram illustrating a semiconductor integrated circuit device according to an eighth embodiment of the present invention.

FIG. 12 illustrates a circuit configuration of a semiconductor integrated circuit device according to the eighth embodiment. In FIG. 12, components also shown in FIG. 8 are denoted by the same reference numerals, and description thereof will be omitted.

As illustrated in FIG. 12, the semiconductor integrated circuit device of the eighth embodiment includes, in a trigger circuit 4G, a NOR gate 18 and an inverter 17 are used, instead of one inverter for applying a control voltage to the gate of an NMOS transistor 12. The NOR gate 18 has a first input terminal connected to a connection node between a capacitor 10 and a fourth resistor 11 and a second input terminal receiving an output from the inverter 17. The inverter 17 has its input terminal connected to the drain of the nMOS transistor 12, i.e., a second trigger terminal 14.

Hereinafter, operation of the trigger circuit 4G will be described.

In the semiconductor integrated circuit device illustrated in FIG. 12, the capacitor 10 is connected between a ground line 2 and the first input terminal of the NOR gate 18 in the trigger circuit 4G. Accordingly, when a surge of positive charge is applied to a power line 1 with the ground line 2 grounded during an ESD test, for example, the potential at the first input terminal of the NOR gate 18 in the trigger circuit 4G is reduced by the fourth resistor 11 though the potential at the power line 1 rises. At this time, since the input terminal of the inverter 17 is connected to the power line 1 through a fifth resistor 13 and the potential at this input terminal is at a high level, the potential at the second input terminal of the NOR gate 18, on the other hand, is at a low level. Accordingly, when the potential at the first input terminal goes below the switching level of the NOR gate 18, the NOR gate 18 outputs a high-level potential to the gate of the NMOS transistor 12. This high-level potential turns the NMOS transistor 12 in the trigger circuit 4G ON, so that the second trigger terminal 14 and the ground line 2 become conductive, and the voltage at the second trigger terminal 14 drops. Because of the drop of the voltage at the second trigger terminal 14, when the potential difference between the second trigger terminal 14 and the power line 1 exceeds the built-in voltage of a diode in an SCR protection circuit 3, base current (SCR trigger current) flowing from the power line 1 to the second trigger terminal 14 occurs in a pnp bipolar transistor 31. This SCR trigger current makes the pnp bipolar transistor 31 and an npn bipolar transistor 32 conductive, so that the SCR protection circuit 3 turns ON. Accordingly, the flow of current (latch-up phenomenon) is maintained with a very low ON resistance between the anode (i.e., the emitter of the pnp bipolar transistor 31) and the cathode (i.e., the emitter of the npn bipolar transistor 32) in the SCR protection circuit 3.

At this time, since the fifth resistor 13 is provided between the NMOS transistor 12 and the power line 1, the ON current of the NMOS transistor 12 flows through a second resistor 34 and the fifth resistor 13, so that the SCR protection circuit 3 is allowed to turn ON at a voltage lower than the breakdown voltage of the gate oxide film of a MOS transistor included in a protected circuit 5.

In addition, in the eighth embodiment, when the potential at the second trigger terminal 14 goes below the switching level of the inverter 17, the inverter 17 outputs a high-level potential, so that the output value of the NOR gate 18 switches from a high level to a low level. Accordingly, the NMOS transistor 12 receiving the low-level potential at its gate changes to an OFF state, so that current flowing from the power line 1 to the ground line 2 through the NMOS transistor 12 is interrupted. As a result, excessive current flowing through the nMOS transistor 12 is blocked, so that destruction caused by a surge in the nMOS transistor 12 is prevented.

In this manner, in the eighth embodiment, not only the protected circuit 5 but also the trigger circuit 4G is protected against a surge entering from outside the device through the power line 1.

In the second through eighth embodiments, a discharge device, such as a pn diode, capable of causing a positive surge applied to the ground line 2 to be discharged to the power line 1 may be provided, as in the second through fourth modified examples of the first embodiment.

As described above, in a semiconductor integrated circuit device according to the present invention, an SCR protection circuit is allowed to turn ON at a voltage lower than the breakdown voltage of a gate oxide film of a transistor forming a protected circuit and resistance against surges is improved even under advanced process miniaturization. The present invention is particularly useful for semiconductor integrated circuit devices including SCR protection circuits as ESD protection circuits, for example.

What is claimed is:

1. A semiconductor integrated circuit device comprising:
a protected circuit protected against electro-static discharge applied from outside the device;
an SCR protection circuit having:
    a pnp bipolar transistor including an emitter connected to a power line and a collector connected to a trigger terminal;
    an npn bipolar transistor including an emitter connected to a ground line, a collector connected to a base of the pnp bipolar transistor, and a base connected to the trigger terminal;
    a first resistor having one terminal connected to the trigger terminal and the other terminal connected to the ground line; and
    a second resistor having one terminal connected to the power line and the other terminal connected to the collector of the npn bipolar transistor; and
a trigger circuit connected to the trigger terminal and including an RC circuit connected between the power line and the ground line, the RC circuit having a fourth resistor and a capacitor; and
a third resistor having one terminal connected to the trigger terminal and the trigger circuit and the other terminal connected to the ground line, wherein the trigger circuit includes:
a p-transistor having one terminal connected to the power line and another terminal connected to the trigger terminal and the one terminal of the third resistor;
a NAND gate having an output terminal connected to a gate of the p-transistor;
the capacitor having one terminal connected to the power line and another terminal connected to a first input terminal of the NAND gate;
the fourth resistor having one terminal connected to the first input terminal of the NAND gate and the other terminal connected to the ground line; and
an inverter having an input terminal connected to the trigger terminal and an output terminal connected to a second input terminal of the NAND gate.

2. A semiconductor integrated circuit device of comprising:
a protected circuit protected against electro-static discharge applied from outside the device;
an SCR protection circuit having:
    a pnp bipolar transistor including an emitter connected to a power line and a collector connected to a trigger terminal;
    an npn bipolar transistor including an emitter connected to a ground line, a collector connected to a base of the pnp bipolar transistor, and a base connected to the trigger terminal;
    a first resistor having one terminal connected to the trigger terminal and the other terminal connected to the ground line; and
    a second resistor having one terminal connected to the power line and the other terminal connected to the collector of the npn bipolar transistor; and
a trigger circuit connected to the trigger terminal and including an RC circuit connected between the power line and the ground line, the RC circuit having a fourth resistor and a capacitor; and
a third resistor having one terminal connected to the trigger terminal and the trigger circuit and the other terminal connected to the ground line, wherein the trigger circuit includes:
an n-transistor having one terminal connected to the power line and another terminal connected to the trigger terminal and the one terminal of the third resistor;
a NOR gate having an output terminal connected to a gate of the n-transistor;
the capacitor having one terminal connected to the ground line and another terminal connected to a first input terminal of the NOR gate; the fourth resistor having one terminal connected to the first input terminal of the NOR gate and the other terminal connected to the power line;
and a buffer having an input terminal connected to the trigger terminal and an output terminal connected to a second input terminal of the NOR gate.

3. A semiconductor integrated circuit device comprising:
a protected circuit protected against electro-static discharge applied from outside the device;
an SCR protection circuit having:
    an npn bipolar transistor including an emitter connected to a ground line and a collector connected to a trigger terminal;
    a pnp bipolar transistor including an emitter connected to a power line, a collector connected to a base of the npn bipolar transistor, and a base connected to the trigger terminal;

a first resistor having one terminal connected to the trigger terminal and the other terminal connected to the power line; and a second resistor having one terminal connected to the ground line and the other terminal connected to the collector of the pnp bipolar transistor; and a trigger circuit connected to the trigger terminal and including an RC circuit connected between the power line and the ground line, the RC circuit having a fourth resistor and a capacitor; and a third resistor having one terminal connected to the trigger terminal and the trigger circuit and the other terminal connected to the power line, wherein the trigger circuit includes:

a p-transistor having one terminal connected to the ground line and another terminal connected to the trigger terminal and the one terminal of the third resistor;

a NAND gate having an output terminal connected to a gate of the p-transistor;

the capacitor having one terminal connected to the power line and another terminal connected to a first input terminal of the NAND gate;

the fourth resistor having one terminal connected to the first input terminal of the NAND gate and the other terminal connected to the ground line; and a buffer having an input terminal connected to the trigger terminal and an output terminal connected to a second input terminal of the NAND gate.

4. A semiconductor integrated circuit device comprising:

a protected circuit protected against electro-static discharge applied from outside the device;

an SCR protection circuit having:

an npn bipolar transistor including an emitter connected to a ground line and a collector connected to a trigger terminal;

a pnp bipolar transistor including an emitter connected to a power line, a collector connected to a base of the npn bipolar transistor, and a base connected to the trigger terminal;

a first resistor having one terminal connected to the trigger terminal and the other terminal connected to the power line; and a second resistor having one terminal connected to the ground line and the other terminal connected to the collector of the pnp bipolar transistor; and a trigger circuit connected to the trigger terminal and including an RC circuit connected between the power line and the ground line, the RC circuit having a fourth resistor and a capacitor; and a third resistor having one terminal connected to the trigger terminal and the trigger circuit and the other terminal connected to the power line, wherein the trigger circuit includes:

an n-transistor having one terminal connected to the ground line and another terminal connected to the trigger terminal and the one terminal of the third resistor;

a NOR gate having an output terminal connected to a gate of the n-transistor;

the capacitor having one terminal connected to the ground line and another terminal connected to a first input terminal of the NOR gate;

the fourth resistor having one terminal connected to the first input terminal of the NOR gate and the other terminal connected to the power line; and an inverter having an input terminal connected to the trigger terminal and an output terminal connected to a second input terminal of the NOR gate.

5. The device of claim 1, comprising a pn diode connected in parallel with the protected circuit and having a cathode connected to the power line and an anode connected to the ground line.

6. The device of claim 1, comprising an nMOS transistor connected in parallel with the protected circuit and having one terminal connected to the power line, another terminal connected to the ground line and a gate connected to the ground line via a fifth resistor.

7. The device of claim 1, comprising a pMOS transistor connected in parallel with the protected circuit and having one terminal connected to the power line, another terminal connected to the ground line and a gate connected to the power line via a fifth resistor.

8. The device of claim 3, comprising a pn diode connected in parallel with the protected circuit and having a cathode connected to the power line and an anode connected to the ground line.

9. The device of claim 3, comprising an nMOS transistor connected in parallel with the protected circuit and having one terminal connected to the power line, another terminal connected to the ground line, and a gate connected to the ground line via a fifth resistor.

10. The device of claim 3, comprising a pMOS transistor connected in parallel with the protected circuit and having one terminal connected to the power line, another terminal connected to the ground line, and a gate connected to the power line via a fifth resistor.

11. The device of claim 2, comprising a pn diode connected in parallel with the protected circuit and having a cathode connected to the power line and an anode connected to the ground line.

12. The device of claim 2, comprising an nMOS transistor connected in parallel with the protected circuit and having one terminal connected to the power line, another terminal connected to the ground line and a gate connected to the ground line via a fifth resistor.

13. The device of claim 2, comprising a pMOS transistor connected in parallel with the protected circuit and having one terminal connected to the power line, another terminal connected to the ground line and a gate connected to the power line via a fifth resistor.

14. The device of claim 4, comprising a pn diode connected in parallel with the protected circuit and having a cathode connected to the power line and an anode connected to the ground line.

15. The device of claim 4, comprising an nMOS transistor connected in parallel with the protected circuit and having one terminal connected to the power line, another terminal connected to the ground line, and a gate connected to the ground line via a fifth resistor.

16. The device of claim 4, comprising a pMOS transistor connected in parallel with the protected circuit and having one terminal connected to the power line, another terminal connected to the ground line, and a gate connected to the power line via a fifth resistor.

* * * * *